United States Patent [19]

Taylor

[11] Patent Number: 4,940,969
[45] Date of Patent: Jul. 10, 1990

[54] APPARATUS AND METHOD FOR INDICATING WHEN IT IS SAFE AND UNSAFE TO INSERT A MEMORY CARTRIDGE INTO OR REMOVE A MEMORY CARTRIDGE FROM A MEMORY CARTRIDGE RECEIVING DEVICE

[75] Inventor: Danny R. Taylor, Groton, N.Y.
[73] Assignee: Databook, Inc., Ithaca, N.Y.
[21] Appl. No.: 354,473
[22] Filed: May 22, 1989
[51] Int. Cl.$^5$ ............................................ G08B 21/00
[52] U.S. Cl. .................................... 340/653; 340/635; 365/52
[58] Field of Search ................. 340/635, 653; 364/900; 360/93, 137; 365/52

[56] References Cited

U.S. PATENT DOCUMENTS

| | | | |
|---|---|---|---|
| 4,245,331 | 1/1981 | Hamaro et al. | 340/656 X |
| 4,730,156 | 3/1988 | Matsuda | 340/653 X |
| 4,785,363 | 11/1988 | Jacobs et al. | 360/96.5 X |

Primary Examiner—Joseph A. Orsino
Assistant Examiner—Jeffery A. Hofsass

[57] ABSTRACT

An apparatus and method are provided for indicating when it is safe and unsafe to insert a memory cartridge into and remove a memory cartridge from a cartridge receiving device. In one embodiment, the cartridge receiving device includes at least one buffer for buffering information signals to be supplied to the memory cartridge althrough such buffer need not necessarily be located within said cartridge receiving device. The apparatus includes an indicator which is caused to assume a first state to indicate to a user that it is unsafe to insert the memory cartridge into or remove the memory cartridge from the receiving device when at least one of the two following conditions occurs: (1) an attempt is being made to write data to or read data from the memory cartridge, (2) at least one buffer is enabled at the same time the memory cartridge is not present in the receiving device.

14 Claims, 4 Drawing Sheets

APPARATUS AND METHOD FOR INDICATING WHEN IT IS SAFE AND UNSAFE TO INSERT A MEMORY CARTRIDGE INTO OR REMOVE A MEMORY CARTRIDGE FROM A MEMORY CARTRIDGE RECEIVING DEVICE

BACKGROUND OF THE INVENTION

This invention relates in general to solid state memory cartridges and, more particularly, to busy indicators for such devices.

BRIEF SUMMARY OF THE INVENTION

Solid state memory cartridges, also referred to as random access memory (RAM) cartridges, are known to be a reliable and durable data storage media. One type of solid state memory cartridge is shown in FIG. 1 as including a card-like main body 10, one end of which contains a plurality of connecting pins 15 on which address, data and control signals are communicated. Solid state memory cartridges may be plugged into a memory cartridge receiving apparatus such as that shown in the copending patent application entitled "Apparatus And Method For Extracting An Electronic Circuit Module From A Housing", Attorney Docket Number DATA89M1, Ser. No. (serial number not assigned), filed on (filing date not assigned). The connecting pins 15 of memory cartridge 10 are inserted in a connector within the memory cartridge receiving apparatus to couple the cartridge to associated electronic circuitry which provides for the writing of data to the cartridge, the reading of data from the cartridge and control of the operation of the cartridge. A desirable characteristic of memory cartridge 10 is that it is removable, that is, it can be removed from the aforementioned connector and be replaced by another memory cartridge.

Generally, memory cartridge 10 is coupled to a host computer or processor 20 which provides address, data and control signals to memory cartridge 10 as shown in FIG. 2. More specifically, in the example of FIG. 2, processor 20 is coupled via address bus 25, data bus 30 and control bus 35 to memory cartridge 10. Each of busses 25, 30 and 35 have respective buffers 40 therein which are capable of isolating memory cartridge 10 from processor 20 and the processor's address, data and control signals. A cartridge connector (not shown) situated within the cartridge receiving apparatus is used to electrically and mechanically couple cartridge 10 to buffers 40.

Unfortunately, despite their rugged and reliable nature, solid state memory cartridges are subject to physical damage when improper or invalid electrical signals are applied to the connecting pins of the cartridge. The risk of such improper signals being applied to the memory cartridge is greatest during those times when the cartridge is being inserted into and removed from the connector within the memory cartridge receiving apparatus.

Typically, to protect memory cartridge 10 from physical damage as well as to protect the data stored therein, the buffers 40 which couple processor 20 to memory cartridge 10 are placed in a high impedance state or are otherwise disabled prior to insertion of cartridge 10 into the cartridge connector. These buffers 40 are then enabled after a predetermined time delay has expired from the time of insertion of cartridge 10 into the cartridge connector. In this manner, cartridge 10 is isolated while any contact bounce with the connector is permitted to settle and power supplied to the cartridge is allowed to stabilize. In some applications, power to memory cartridge 10 is switched off prior to insertion of cartridge 10 in the cartridge connector.

Many mass storage devices, such as floppy disk drives for example, are often equipped with a busy light to indicate to the user when it is unsafe to remove a removable floppy disk situated within the drive. Typically, the busy light on the drive is turned on when the system is attempting to access the drive to write data on the disk and when the system is attempting to access the drive to read data from the disk. The light is otherwise off which suggests to the user that it is safe to remove the disk from the drive. Thus with the above type of busy light, the user merely receives an indication that the system is trying to access the disk.

However, the nature of removable solid state memory cartridges is such that the operator of a computer system using such a cartridge may not always be aware that system software is attempting to access a memory cartridge connector socket if a cartridge is not installed in that connector socket. Moreover, many hardware and software failure modes exist whereby the cartridge output buffers, such as buffers 40 of FIG. 2, may undesirably become enabled when a cartridge is not present in the cartridge receiving apparatus or drive. It will thus be appreciated that it is possible for the cartridge output buffers, which connect directly to the cartridge, to undesirably become enabled at a time when the user is attempting to insert a cartridge. Such an insertion may cause corruption of some of the data stored in the memory cartridge because the cartridge may sense a "write command" during a time when power to the cartridge is coming up and no particular address or data is specified to the cartridge. In this situation, the data integrity of the cartridge is significantly compromised.

In view of the foregoing, it will be appreciated that in the case of solid state memory cartridges, a busy indicator which merely warns the user when the system is attempting to access a cartridge is insufficient to assure a user that it is presently safe to insert a cartridge into a cartridge receiving apparatus.

Accordingly, one object of the present invention is to provide an apparatus and method for indicating to a solid state memory cartridge user when it is truly safe and unsafe to insert a memory cartridge into a cartridge receiving apparatus.

In accordance with the present invention, an indicator apparatus is provided for indicating when it is unsafe to insert a memory cartridge into or remove a memory cartridge from a memory cartridge receiving device, the receiving device being adapted for use in conjunction with at least one buffer which buffers information signals to be supplied to the memory cartridge. The indicator apparatus and the buffer are responsive to a buffer enable signal. The indicator apparatus is responsive to a cartridge presence signal which indicates when the cartridge is present and not present in the receiving device. The indicator apparatus is further responsive to a busy signal which indicates when an attempt is being made to access the memory cartridge. The indicator apparatus includes an indicator perceivable by a user. The indicator apparatus further includes a logic circuit responsive to the busy signal, the buffer enable signal and the cartridge presence signal. The logic circuit is coupled to the indicator to cause the indicator to assume a first state to indicate that it is unsafe to insert the cartridge into or remove the cartridge from the receiving device when at least one of the two following conditions occurs: (1) an attempt is being made to access the memory cartridge; (2) at least one buffer is enabled at the same time the memory cartridge is not present in the receiving device. In one embodiment of the invention, the logic circuit causes the indicator to assume the second state when neither of the two conditions occurs.

The features of the invention believed to be novel are specifically set forth in the appended claims. However, the invention itself, both as to its structure and method of operation, may best be understood by referring to the following description and accompanying drawings.

DETAILED DESCRIPTION OF THE INVENTION

Figure 1:
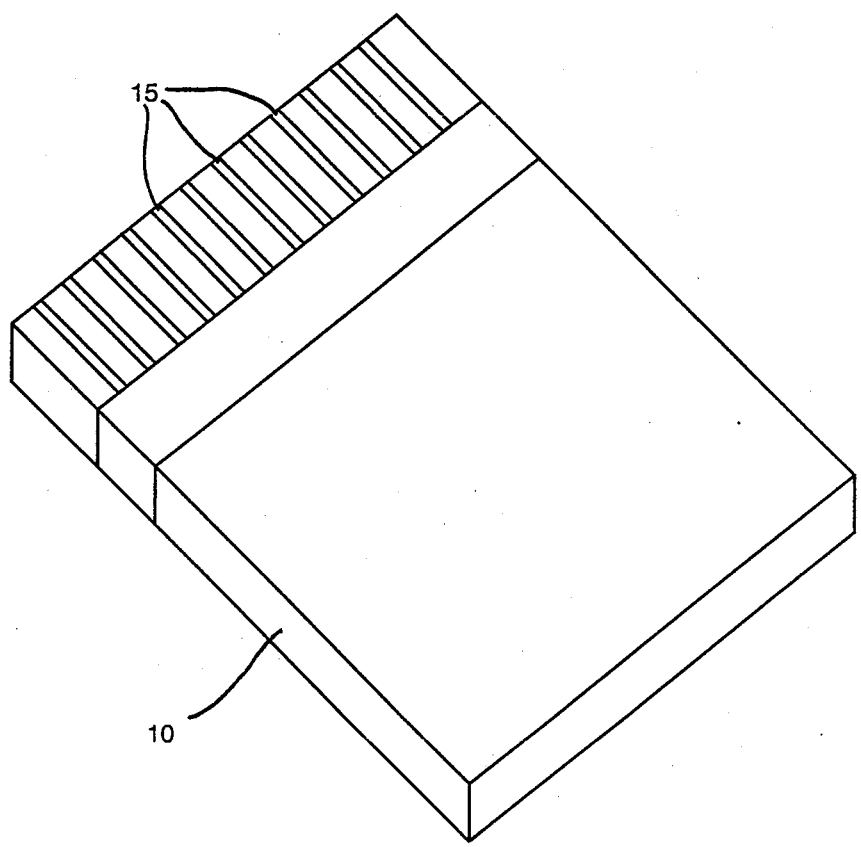
FIG. 1 is a left side perspective of a solid state memory cartridge.
Figure 2:
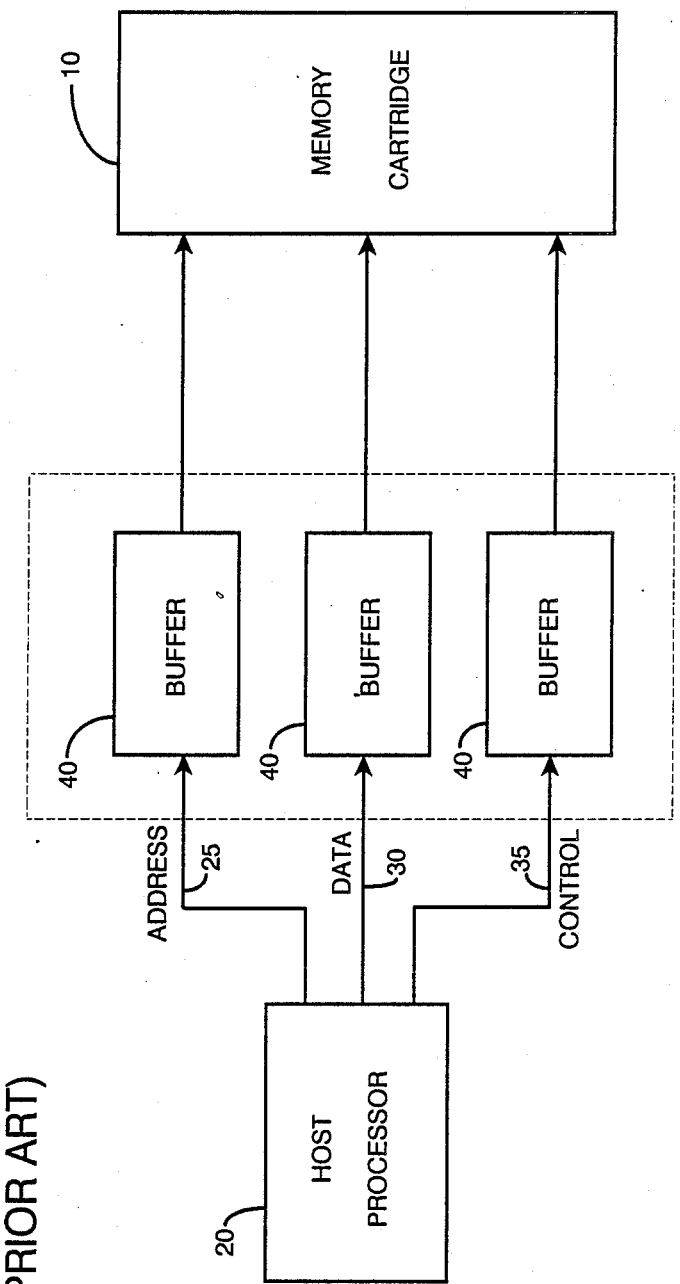
FIG. 2 is a simplified block diagram of a conventional circuit arrangement for coupling a computer processor to a solid state memory cartridge.
Figure 3:
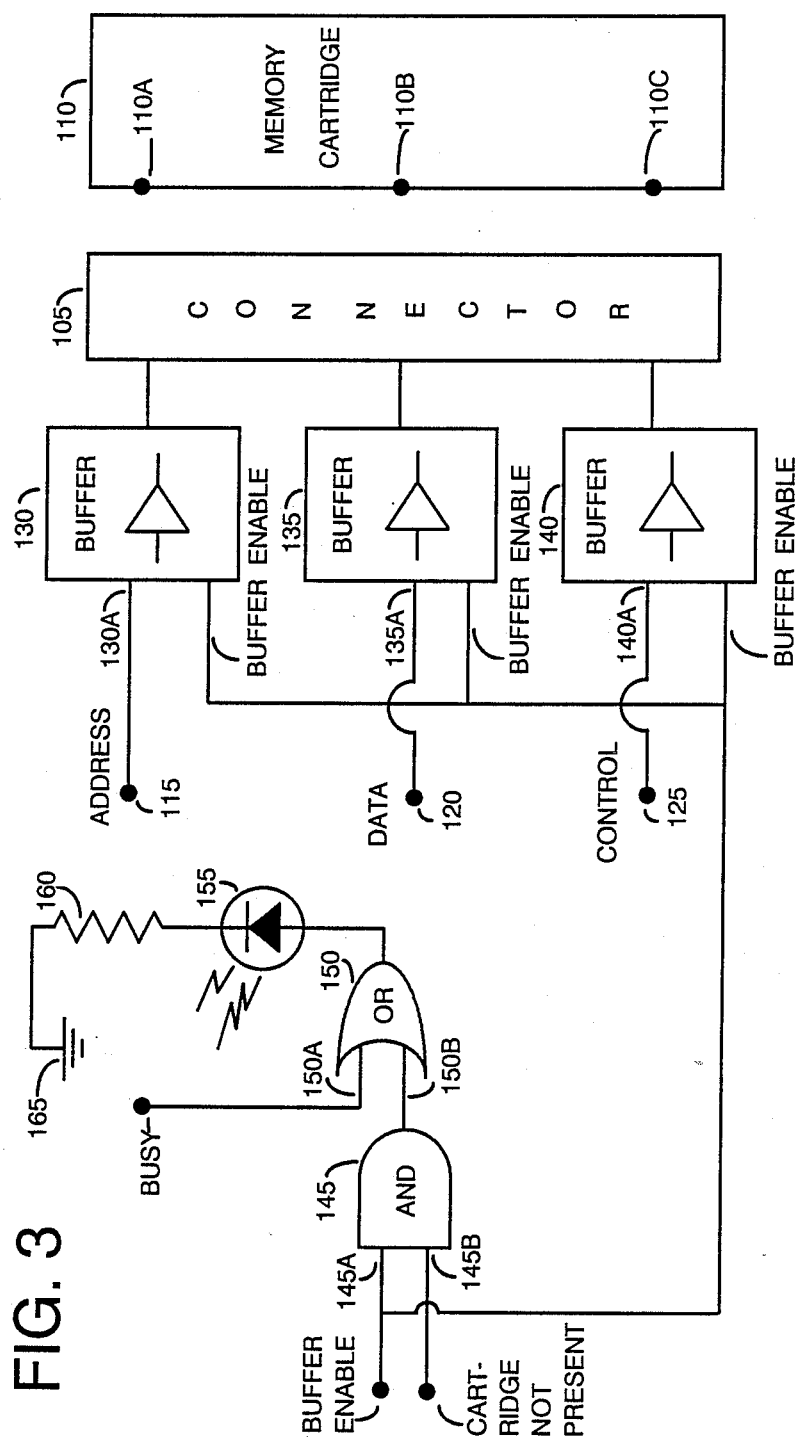
FIG. 3 is aschematic block diagram of the indicator apparatusof the present invention implemented in positive true logic.

In accordance with one embodiment of the present invention, FIG. 3 shows a schematic block diagram of the indicator apparatus of the present invention as indicator apparatus 100. Apparatus 100 is implemented in positive true logic although those skilled in the art will appreciate that equivalent logic such as negative true logic may be used as well to implement apparatus 100 as will be discussed later. In FIG. 3, indicator apparatus 100 is shown as including a multi-pin connector 105 for receiving a solid state memory cartridge 110 therein. One solid state memory cartridge which may be employed as memory cartridge 110 is the Model RBC008IE00 memory cartridge manufactured by Epson Corporation. Although this particular cartridge has a memory storage capacity of 8 Kbytes, those skilled in the art will appreciate that the indicator apparatus of the invention may be used in conjunction with memory cartridges having other storage capacities as well. Memory cartridge 110 includes an address port 110A, a data port 110B and a control port 110C to which buffered address, buffered data and buffered control signals are provided, respectively, via connector 105 as described subsequently.

Information signals, namely address signals, data signals and control signals suitable for cartridge 110 are generated in the conventional manner and are provided to address input 115, data input 120 and control input 125, respectively. Address input 115, data input 120 and control input 125 are bus inputs. In one embodiment of the invention, apparatus 100 includes an address buffer 130 coupled between address signal input 115 and cartridge address port 110A, a data signal buffer 135 coupled between data signal input 120 and cartridge data port 110B and a control signal buffer 140 coupled between control input 125 and cartridge control port 110C. Tri-state buffers may be used as buffers 130, 135 and 140.

In more detail, buffers 130, 135 and 140 include inputs 130A, 135A and 140A, respectively, and further include outputs 130B, 135B and 140B, respectively, as shown in FIG. 3. Thus, when memory cartridge 110 is inserted into connector 105, buffer output 130B is coupled to cartridge address port 110A, buffer output 135B is coupled to cartridge data port 110B and buffer output 140B is coupled to cartridge control port 110C. It will be appreciated that buffer outputs 130B, 135B and 140B are multi-conductor busses and that memory cartridge ports 110A, 110B and 110C are correspondingly multi-conductor ports.

Each of buffers 130, 135 and 140 includes an enable input designated BUFFER ENABLE which when set to a logical high state (1) causes the signals at inputs 130A, 135A and 140A to pass through to the output of the respective buffers. However, when the BUFFER ENABLE inputs of buffers 130, 135 and 140 are set to a logical low state (0), then the respective buffers 130, 135 and 140 are placed in a high impedance state which prevents the signals at the inputs of the buffers from passing through to the outputs of the buffers. The signal which is supplied to the BUFFER ENABLE inputs of buffers 130, 135 and 140 is referred to subsequently as the BUFFER ENABLE signal. From the above, it will be appreciated that depending on whether the BUFFER ENABLE signal is set to 1 or 0 will determine if the ADDRESS, DATA and CONTROL signals are provided to the respective ports on memory cartridge 110 or if the ADDRESS, DATA and CONTROL signals are prevented from reaching cartridge 110.

Apparatus 100 includes an AND gate 145 having inputs 145A and 145B. The BUFFER ENABLE signal is provided to input 145A and to the BUFFER ENABLE inputs of buffers 130, 135 and 140. The BUFFER ENABLE signal is generated in a conventional manner. When the BUFFER ENABLE signal is high, buffers 130, 135 and 140 are enabled to permit the passage of information from the inputs thereof to the outputs thereof. As explained earlier, should one or more of buffers 130, 135 and 140 be enabled when memory cartridge 110 is not present in connector 105, it is unsafe to insert memory cartridge 110 into connector 105 since to do so may cause physical damage to memory cartridge 110 or destroy the data in cartridge 110.

The BUFFER ENABLE signal is active high any time cartridge 110 is inserted in connector 105 and the cartridge insertion sequence (delay and cartridge power switching, if applicable) has been completed. The BUFFER ENABLE signal remains high during the entire time which cartridge 110 is inserted in connector 105.

A CARTRIDGE NOT PRESENT signal is provided to AND gate input 145B as shown in FIG. 3. The CARTRIDGE NOT PRESENT signal is generated in the conventional manner. In one embodiment of the invention, the CARTRIDGE NOT PRESENT signal exhibits a high (1) logical state when memory cartridge 110 is not present in connector 105 and exhibits a low (0) logical state when cartridge 110 is present in connector 105. For example, one CARTRIDGE NOT PRESENT pin (not shown) on connector 105 is maintained at a high (1) logic state when memory cartridge 110 is not plugged into connector 105. The CARTRIDGE NOT PRESENT signal is thus high when memory cartridge 110 is not yet inserted in connector 105. However, when cartridge 110 is inserted into connector 105, a selected grounding pin on cartridge 110 mates with the CARTRIDGE NOT PRESENT pin on connector 105 and causes the voltage on the CARTRIDGE NOT PRESENT pin to be driven to a low (0) logic state.

The output of AND gate 145 is coupled to input 150B of a two input OR gate 150 having inputs 150A and 150B. A BUSY signal is provided to the remaining input 150A of OR gate 150. The BUSY signal is generated in the conventional manner.

The following describes how a BUSY signal is conventionally generated. The BUSY signal is typically generated from a drive select signal which goes high when a particular memory drive is selected for access. That is, when a particular drive is selected for access to have data written to or read from such drive, the drive select signal goes high and the BUSY signal derived therefrom also goes high.

The output of OR gate 150 is coupled to the anode of a light emitting diode (LED) indicator 155, the cathode of which is coupled through a limiting resistor 160 to a ground at 165. Those skilled in the art will appreciated that indicators other then LED 155 may be used in for indicator 155. For example, other visual indicators such as liquid crystal devices (LCD's), gas plasma devices, incandescent visual indicators and the like may be used as well for indicator 155. Moreover, auditory indicators such electroacoustic transducers may be employed as indicator 155.

As will now be explained in more detail, when indicator LED 155 is on, the user is warned that it is unsafe to insert memory cartridge 110 into connector 105. Conversely, when indicator LED 155 is off, the user is informed that it is presently safe to insert cartridge 110 into connector 105.

Whenever the BUSY signal provided to OR gate input 150A is high, which indicates that the host processor (not shown) which initiated generation of the BUSY signal or other entity is trying to access cartridge 110, then the output of OR gate goes high to turn on LED 155. This indicates an unsafe time for cartridge insertion.

Moreover, when the BUFFER ENABLE signal provided to AND gate 145 goes high (indicating that buffers 130, 135 and 140 are enabled) at the same time that the CARTRIDGE NOT PRESENT signal provided to AND gate 145 goes high (indicating that cartridge 110 is not inserted in connector 105), then the output of AND gate 145 goes high. When this occurs, the output of OR gate 150 is also driven high and LED indicator 155 is turned on. Thus, when both the "cartridge not present" and "buffer(s) enabled" conditions occur simultaneously, indicator 155 is turned on to inform the user that it is unsafe to insert cartridge 110 into connector 105.

Figure 4:
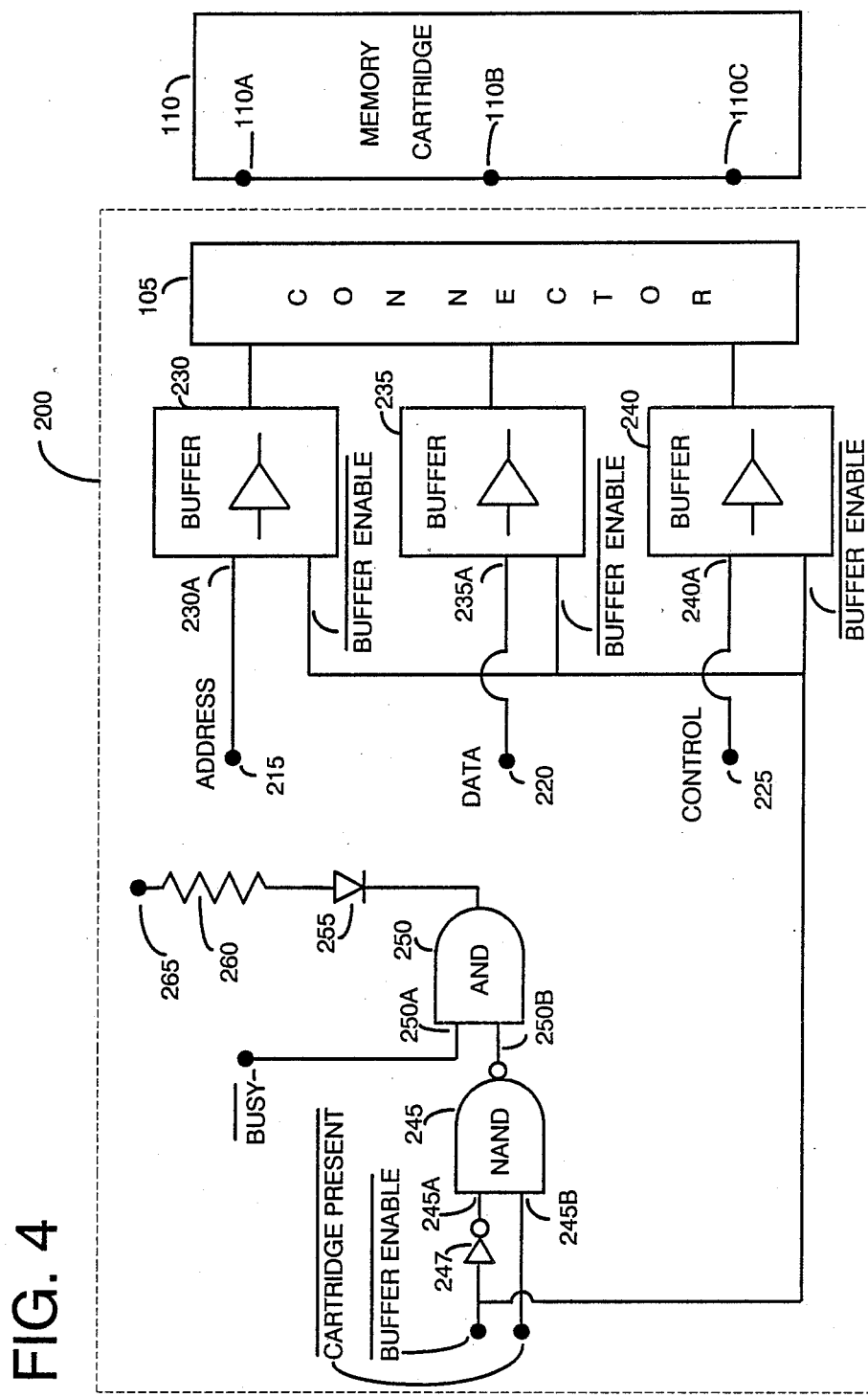
FIG. 4 is a schematic block diagram of the indicator apparatus of the present invention implemented in negative true logic.

For sake of completeness, FIG. 4 is included to show an embodiment of the indicator apparatus of the present invention implemented in negative true logic as indicator apparatus 200. Indicator apparatus 200 of FIG. 4 is substantially similar to indicator apparatus 100 of FIG. 3 with like numbers being used to designate like components in the drawings.

In indicator apparatus 200, a NAND gate 245 in conjunction with an inverter 247 on input 245A thereof, performs essentially the same function as AND gate 145 of apparatus 100 of FIG. 3. More specifically, the complement of the BUFFER ENABLE signal is supplied through inverter 247 to NAND gate input 245A. The complement of a CARTRIDGE PRESENT signal is supplied to NAND gate input 245B. In this embodiment of the invention, when the complement of the BUFFER ENABLE signal is 0, then buffers 230, 235 and 240 are enabled, and conversely when the complement of the BUFFER ENABLE signal is 1, then buffers 230, 235 and 240 are not enabled. Also, when the complement of the CARTRIDGE PRESENT signal is 0, then memory cartridge 110 is present in connector 105, and conversely when the complement of the CARTRIDGE PRESENT signal is 1 , then memory cartridge 110 is not present in connector 105.

In indicator apparatus 200, AND gate 250 performs essentially the same function as OR gate 150 of apparatus 100. The output of AND gate 250 is coupled to the anode of an LED indicator 255, the cathode of which is coupled via a limiting resistor 260 to a positive voltage source (not shown) at terminal 265. Address signal input 215, data signal input 220 and control signal input 225 correspond to inputs 115, 120 and 125 of apparatus 100. Buffers 230, 235 and 240 correspond to buffers 130, 135 and 140 of apparatus 100 except for the modification that the BUFFER ENABLE inputs of buffers 230, 235 and 240 exhibit negative true logic and are thus supplied with the complement of the BUFFER ENABLE signal as seen in FIG. 4.

Although in the above described embodiment of the invention, all of buffers 130 135 and 140 are enabled/disabled to prevent the writing of undesired data to cartridge 110, other embodiments of the invention are contemplated wherein not all of buffers 130, 135 and 140 need to be enabled/disabled in the above described manner. For example, in some types of memory cartridges 110, only the control signal buffer 135 need be enabled/disabled to control the writing of data to cartridge 110. In this instance, only the control signal buffer 140 need be enabled/disabled in the manner already described.

While an indicator apparatus has been described above, it will be appreciated that a method for indicating to a user when it is unsafe to insert a memory cartridge into a memory cartridge receiving device has also been disclosed. The receiving device on which the method is practiced is adapted for use in conjunction with at least one buffer which buffers information signals to be supplied to the memory cartridge. The method includes the step of providing an indicator perceivable by the user. The method further includes the step of causing the indicator to assume a first state to indicate to the user that it is unsafe to insert the cartridge in the receiving device when at least one of the two following conditions occurs: (1) an attempt is being made to access said memory cartridge, that is, an attempt is being made to write data to or read data from the memory cartridge, (2) the at least one buffer is enabled at the same time the memory cartridge is not present in the receiving device. In one embodiment of the method, the method further includes the step of otherwise causing the indicator to assume a second state indicating to the user that it is safe to insert the cartridge into the receiving device at times when neither of the two conditions occurs.

The foregoing describes an apparatus and method for indicating when it is unsafe and safe for a user to insert a memory cartridge into a memory cartridge receiving device. An indicator is activated to notify the user of the unsafe cartridge insertion condition when an attempt is being made to write data to or read data from the memory cartridge. Moreover, the indicator is activated to notify the user of an unsafe cartridge insertion condition when at least one buffer of buffers 130, 135 and 140 is enabled at the same time that the memory cartridge is not present in the cartridge receiving device.

While only certain preferred features of the invention have been shown by way of illustration, many modifications and changes will occur to those skilled in the art. For example, while for a solid state memory cartridge having contact pins may be employed as memory cartridge 110, non-contact type memory cartridges such as the R-32KB LSI card available from Nippon LSI Card Co., LTD may also be employed as card 110 with suitable modifications to connector 105. It is, therefore, to be understood that the present claims are intended to cover all such modifications and changes which fall within the true spirit of the invention.

I claim:

1. An indicator apparatus for indicating when it is unsafe to insert a memory cartridge into or remove a memory cartridge from a memory cartridge receiving device, said receiving device being adapted for use in conjunction with at least one buffer which buffers information signals to be supplied to said memory cartridge, said indicator apparatus and said at least one buffer being responsive to a buffer enable signal, said indicator apparatus being responsive to a cartridge presence signal which indicates when said cartridge is present and not present in said receiving device, said indicator apparatus being responsive to a busy signal which indicates when an attempt is being made to access said memory cartridge, said apparatus comprising:

an indicator perceivable by a user, and logic circuit means responsive to said busy signal, said buffer enable signal and said cartridge presence signal, said logic means being coupled to said indicator, said logic means causing said indicator to assume a first state to indicate that it is unsafe to insert said cartridge into or remove said cartridge from said receiving device when at either of the two following conditions occurs:
   (1) an attempt is being made to access said memory cartridge,
   (2) said at least one buffer is enabled at the same time said memory cartridge is not present in said receiving device.

2. The indicator apparatus of claim 1 wherein said logic means causes said indicator to assume said second state if neither of said two conditions occurs.

3. The indicator apparatus of claim 1 wherein said indicator is a visual indicator.

4. The indicator apparatus of claim 1 wherein said indicator is an audio indicator.

5. An indicator apparatus for indicating when it is unsafe to insert a memory cartridge into or remove a memory cartridge from a memory cartridge receiving device, said receiving device including at least one buffer to buffer information signals to be supplied to said memory cartridge, said indicator apparatus and said at least one buffer being responsive to a buffer enable signal, said indicator apparatus being responsive to a cartridge presence signal which indicates when said cartridge is present and not present in said receiving device, said indicator apparatus being responsive to a busy signal which indicates when an attempt is being made to write data to or read data from said memory cartridge, said apparatus comprising:

an indicator perceivable by a user, said indicator assuming a first state to indicate that it is unsafe to insert said cartridge into or remove said cartridge from said receiving device, said indicator assuming a second state to indicate that it is safe to insert said cartridge into or remove said cartridge from said receiving device;

AND circuit means, including an output, for AND'ing said buffer enable signal with said cartridge presence signal to generate a first signal which indicates when said buffer enable signal corresponds to said at least one buffer being enabled simultaneously with the cartridge presence signal indicating that said cartridge is not present in said receiving device, and OR circuit means, coupled to the output of said AND circuit means, for OR'ing said first signal with said busy signal to cause said indicator to assume said first state when at either of the following conditions occurs:
   (1) said busy signal indicates that an attempt is being made to write data to or read data from said memory cartridge;
   (2) said first signal indicates that said at least one buffer is enabled and said cartridge presence signal indicates that said cartridge is not present in said receiving device, said indicator otherwise assuming said second state.

6. The indicator apparatus of claim 5 wherein said indicator is a visual indicator.

7. The indicator apparatus of claim 5 wherein said indicator is an audio indicator.

8. A method of indicating to a user when it is unsafe to insert a memory cartridge into or remove a memory cartridge from a memory cartridge receiving device, said receiving device being adapted for use in conjunction with at least one buffer which buffers information signals to be supplied to said memory cartridge, said method comprising the steps of:

providing an indicator perceivable by said user;
   causing said indicator to assume a first state to indicate to said user that it is unsafe to insert said cartridge into or remove said cartridge from said receiving device when at either of the two following conditions occurs:
   (1) an attempt is being made to access said memory cartridge,
   (2) said at least one buffer is enabled at the same time said memory cartridge is not present in said receiving device.

9. The method of claim 8 including the step of otherwise causing said indicator to assume a second state indicating to said user that user that it is safe to insert said cartridge into or remove said cartridge from said receiving device at times when neither of said two conditions occurs.

10. The method of claim 8 wherein a visual indicator is employed in said providing an indicator step.

11. The method of claim 8 wherein an audio indicator is employed in said providing an indicator step.

12. A method of indicating to a user when it is unsafe to insert a memory cartridge into or remove a memory cartridge from a memory cartridge receiving device, said receiving device including at least one buffer to buffer information signals to be supplied to said memory cartridge, a cartridge presence signal being generated to indicate when said cartridge is present and not present in said receiving device, a buffer enable signal being generated to indicate when said at least one buffer is enabled, a busy signal being generated to indicate when an attempt is being made to write data to or read data from said memory cartridge, said method comprising the steps of:

providing an indicator perceivable by said user, said indicator assuming a first state to indicate to said user that it is unsafe to insert said memory cartridge into or remove said memory cartridge from said receiving device, said indicator assuming a second state to indicate to said user that it is safe to insert said memory cartridge into or remove said memory cartridge from said receiving device;

AND'ing said buffer enable signal with said cartridge presence signal to general a first signal which indicates when said buffer enable signal corresponds to said at least one buffer being enabled simultaneously with the cartridge presence signal indicating that said cartridge is not present in said receiving device, and OR'ing said first signal with said busy signal to cause said indicator to assume said first state when at either of the following conditions occurs:
(1) said busy signal indicates that an attempt is being made to write data to or read data from said memory cartridge;
(2) said first signal indicates that said at least one buffer is enabled at the same time that said cartridge presence signal indicates that said cartridge is not present in said receiving device, said indicator otherwise assuming said second state.

13. The method of claim 12 wherein a visual indicator is employed in said providing an indicator step.

14. The method of claim 12 wherein an audio indicator is employed in said providing an indicator step.

* * * * *